(12) United States Patent
Lagally et al.

(10) Patent No.: US 8,803,195 B2
(45) Date of Patent: Aug. 12, 2014

(54) NANOMEMBRANE STRUCTURES HAVING MIXED CRYSTALLINE ORIENTATIONS AND COMPOSITIONS

(75) Inventors: Max G. Lagally, Madison, WI (US); Shelley A. Scott, Madison, WI (US); Donald E. Savage, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 1153 days.

(21) Appl. No.: 12/045,263

(22) Filed: Mar. 10, 2008

(65) Prior Publication Data
US 2009/0032842 A1 Feb. 5, 2009

Related U.S. Application Data

(60) Provisional application No. 60/953,591, filed on Aug. 2, 2007.

(51) Int. Cl.
*H01L 21/02* (2006.01)

(52) U.S. Cl.
USPC .................................... 257/190; 257/E21.09

(58) Field of Classification Search
USPC .............. 257/347, 351, 374, 616, 619, 627, 257/E29.104, E29.167
See application file for complete search history.

(56) References Cited

U.S. PATENT DOCUMENTS

| | | | |
|---|---|---|---|
| 5,148,247 A * | 9/1992 | Miura et al. .................. | 257/262 |
| 6,830,962 B1 | 12/2004 | Guarini et al. | |
| 7,023,057 B2 | 4/2006 | Ieong et al. | |
| 7,087,965 B2 | 8/2006 | Chan et al. | |
| 7,138,683 B2 | 11/2006 | Guarini et al. | |
| 7,229,901 B2 | 6/2007 | Savage et al. | |
| 7,253,034 B2 | 8/2007 | Chan et al. | |
| 7,354,809 B2 | 4/2008 | Yuan et al. | |
| 7,405,436 B2 | 7/2008 | Chidambarrao et al. | |
| 2004/0195623 A1* | 10/2004 | Ge et al. ........................ | 257/347 |
| 2005/0093104 A1 | 5/2005 | Ieong et al. | |
| 2005/0116290 A1 | 6/2005 | de Souza et al. | |
| 2005/0199984 A1 | 9/2005 | Nowak | |
| 2005/0236687 A1 | 10/2005 | Chan et al. | |
| 2006/0094175 A1 | 5/2006 | Cohen et al. | |
| 2006/0134893 A1* | 6/2006 | Savage et al. ................. | 438/483 |
| 2007/0187719 A1 | 8/2007 | Yuan et al. | |
| 2007/0238233 A1* | 10/2007 | Sadaka et al. ................. | 438/187 |
| 2007/0269963 A1* | 11/2007 | Cheng et al. .................. | 438/479 |

FOREIGN PATENT DOCUMENTS

WO 2006065444 6/2006

OTHER PUBLICATIONS

PCT Invitation to Pay Additional Fees, mailed Mar. 6, 2009.
PCT Intrenational Search Report and Written Opinion, mailed on May 13, 2009.
U.S. Appl. No. 11/517,812, filed Sep. 8, 2006, Ma et al.
Homstra, J. et al., "Determination of the Lattice Constant of Epitaxial Layers of III-V Compounds," *J. Crystal Growth* 44. pp. 513-517 (1978); published by North-Holland Publishing Company.

(Continued)

*Primary Examiner* — Vongsavanh Sengdara
(74) *Attorney, Agent, or Firm* — Bell & Manning, LLC (57) ABSTRACT

The present nanomembrane structures include a multilayer film comprising a single-crystalline layer of semiconductor material disposed between two other single-crystalline layers of semiconductor material. A plurality of holes extending through the nanomembrane are at least partially, and preferably entirely, filled with a filler material which is also a semiconductor, but which differs from the nanomembrane semiconductor materials in composition, crystal orientation, or both.

17 Claims, 3 Drawing Sheets

(56) References Cited

OTHER PUBLICATIONS

Fatemi, M., "Characterization of semiconductor strained layers grown on (110)-type substrates by high-resolution X-ray diffractometry," *J. Crystal Growth* 169, pp. 261-268 (1996); published by Elsevier Science B.V.

Schäffler, F., "High-mobility Si and Ge structures," *Semicond. Sci. and Technol.* 12, pp. 1515-1549 (1997); published by IOP Publishing Ltd.

Satö, T. et al., "Mobility Anistropy of Electrons in Inversion Layers on Oxidized Silicon Surfaces," *Phys. Rev. B* 4(6), pp. 1950-1960 (Sep. 1971).

Fewster, P. F., "X-ray scattering from semiconductors," Table of Contents and p. 109 of Chapter 3, Imperial College Press, London (2000).

Rim, K. et al., "Fabrication and Mobility characteristics of Ultra-thin Strained Si Directly on Insulator (SSDOI) MOSFETs" *IEDM Tech. Digest* 3.1.1.-3.1.3 (2003).

Mizuno, T. et al., "(110)-Surface Strained-SOI CMOS Devices," *IEEE Trans. Electron Devices*, 52(3), pp. 367-374 (Mar. 2005).

Yuan, H.-C. et al., "N-type Thin-film Transistors Fabricated on Transferred, Elastically Strain-Shared Si/SiGe/Si Membranes," *2005 International Semiconductor Device Research Symposium*, IEEE, Piscataway, NJ, 207 (2005).

Roberts, M. M. et al., "Elastically relaxed free-standing strained-silicon nanomembranes," *Nature Materials* 5, pp. 388-393 (May 2006).

Yuan, H.-C. et al., "High-speed strained-single-crystal-silicon thin-film transistors on flexible polymers," *J. Appl. Phys.* 100, pp. 013708-1-013708-5 (2006); published by American Institute of Physics.

Yang, M. et al., "Hybrid-Orientation Technology (HOT): Opportunities and Challenges," *IEEE Transactions on Electron Devices*, 53(5) pp. 965-798 (May 2006).

Scott, S. A. et al., "Elastically strain-sharing nanomembranes: flexible and transferable strained silicon and silicon-germanium alloys," *J. Phys. D. Appl. Phys.* 40, R75-R92 (2007); published by IOP Publishing Ltd., printed in the UK.

Opotowsky, A. C. et al., "Structure of elastically strain-sharing silicon (110) nanomembranes," *New J. Phys.* 9 (Aug. 2007) 270 (12 pages); published by IOP Publishing Ltd and Deutsche Physikalische Gesellschaft.

\* cited by examiner

NANOMEMBRANE STRUCTURES HAVING MIXED CRYSTALLINE ORIENTATIONS AND COMPOSITIONS

CROSS-REFERENCE TO RELATED APPLICATIONS

This application claims the benefit of U.S. Provisional Application Ser. No. 60/953,591 filed Aug. 2, 2007, the entire disclosure of which is incorporated by reference.

STATEMENT OF GOVERNMENT RIGHTS

This invention was made with United States government support awarded by the following agencies: Department of Energy under grant number DE-FG02-03ER46028. The United States government has certain rights in this invention.

FIELD OF THE INVENTION

This invention relates to composite semiconductor thin films that include a thin film of a first semiconductor material having islands of a second semiconductor materials distributed therein. The semiconductor thin films are well-suited for use in CMOS devices.

BACKGROUND OF THE INVENTION

The microelectronics industry is in constant pursuit of increasing the speed and performance of microprocessors. Complementary metal-oxide semiconductors (CMOS), the major class of integrated circuits used in microelectronics, are a particular area of interest. High-carrier-mobility CMOS devices are being investigated because of their potential for enhancing electron (n-type) and hole (p-type) mobility. In order to fully realize the potential of high-carrier-mobility CMOS devices, the development of new materials that are compatible with the scaling of device dimensions is required.

It is well established that strain modifies the band structure of Si, thereby influencing the charge carrier mobility (Schäffler, F., *Semicond. Sci. and Technol.* 12, 1515 (1997)), among other effects. Tensile strain in Si(001) produces significant electron mobility enhancement, but degrades the hole mobility at low levels of strain (Rim, K., et al., *IEDM Tech. Digest* 3.1.1. (2003)). Advanced CMOS applications demand both high electron and high hole mobility. To achieve that goal with Si(001) alone would require the use of very highly strained Si(001), a difficult condition to achieve.

For high-mobility p-type devices, Si(110) is an attractive alternative; as its hole mobility is about twice that of Si(001), although it is still much lower than the Si(001) electron mobility (Sato, T., Takeishi, Y., and Hara, H., *Phys. Rev. B* 4, 1950 (1971). However, when a (110) oriented Si lattice is under biaxial tensile strain, the hole mobility is dramatically enhanced even for relatively small values of strain, and the electron mobility can be improved to a value in excess of 80% of the electron mobility found in unstrained Si(001) (Mizuno, T., Sugiyama, N., Tezuka, T., Moriyama, Y., Nakaharai, S., and Takagi, S., *IEEE Trans. Electron Devices* 52, 367 (2005)). Consequently, strained Si(110) is a good candidate for both high-speed pMOS and advanced CMOS applications where reducing the current drive imbalance between n-type and p-type channels is a major concern. There is also considerable interest in using non-traditional crystal orientations to optimize carrier mobility, by fabricating mixed regions of Si(110) and Si(001) on a single wafer (so-called hybrid-orientation technology (HOT)). HOT architecture allows fabrication of p-channel devices on the high-hole-mobility Si(110) regions, and n-channel devices on the high-electron-mobility Si(100) regions (Yang, M., et al., *IEEE Trans. Electron Devices* 53, 965 (2006)).

SUMMARY OF THE INVENTION

The present invention provides a heterogeneous nanomembrane-based structure that includes a semiconductor thin film comprising a first semiconductor material having distributed therein regions of a second semiconductor material to provide a heterogeneous semiconductor layer structure that enhances the mobility of both electrons and holes. The first and second semiconductor materials may differ in crystalline orientation, semiconductor composition, strain, or a combination thereof. The resulting structure may be viewed as a sort of "quilt" with islands (or inlets) of the second material distributed in the first material.

The thin film may be a single-layer film or a multilayered film, such as a bilayered or trilayered film. This thin film is desirably no greater than about 1,000 nm thick. This includes embodiments wherein the thin film is no greater than 500 nm thick, further includes embodiments wherein the thin film is no greater than 100 nm thick, and still further includes embodiments wherein the thin film is no greater than about 50 nm thick. The thin film may be disposed on an underlying substrate from which the second semiconductor material is grown. This substrate may be a bulk material, such as a conventional semiconductor wafer, or may be a thin film, such as the device layer of a semiconductor-on-insulator substrate.

Because of its wide use in the electronics industry, silicon is a preferred material for the thin films. Thus, the first and second semiconductor materials may comprise silicon with different crystalline orientations and/or in different strain states. For example, the first semiconductor material may be a Si(110) film and the second semiconductor material may be Si(001). However, other crystalline orientations of silicon, including Si(111), may also be used.

In one design, the nanomembrane-based structure includes a single-layer film comprising a single layer of Si(110) with a plurality of holes extending therethrough, wherein Si(001) at least partially, and desirably fully, fills the holes. The single-layer thin film may be disposed on a silicon-on-insulator substrate that includes a Si(001) device layer on a buried oxide layer on a bulk silicon handle wafer. Alternatively, the nanomembrane structure may be a free-standing bilayered structure composed of a thin film of Si(110) disposed on a thin film of Si(001).

In other designs, the nanomembrane-based structures include a multilayer film comprising a single-crystalline layer of compressively strained semiconductor material disposed between a first single-crystalline layer of tensilely strained semiconductor material and a second single-crystalline layer of tensilely strained semiconductor material, wherein a plurality of holes extend through the multilayer film; and a filler material at least partially filling the plurality of holes in the multilayer film, wherein the semiconductor filler material differs from the tensilely strained semiconductor material in composition, crystalline orientation, strain state, or a combination thereof. For example, the nanomembrane may be a trilayer structure that includes a layer of compressively-strained single crystal SiGe alloy sandwiched between two layers of tensilely strained single crystal silicon (e.g., layers of tensilely strained Si(110)). Methods for making such a trilayer structure with a plurality of holes extending through it are described in U.S. Pat. No. 7,229,901, the entire disclosure of which is incorporated herein by reference. As in the case of the single-layer thin films, the trilayer thin film may be disposed on an underlying substrate that is used as a template for the epitaxial growth of the second semiconductor material. This substrate may be a bulk material, such as a conventional semiconductor wafer; or may be a thin film, such as the device layer of a semiconductor-on-insulator substrate. In one embodiment, the nanomembrane structure is a free-standing, four-layer structure composed of the trilayer thin film disposed on a thin-film semiconductor substrate (e.g., Si(001) from which the filler material is grown epitaxilly.

One method for forming the nanomembrane-based structures includes the step of growing a single or multilayer semiconductor film, as described above, on a sacrificial substrate layer, forming a plurality of holes in the semiconductor film to expose areas of the sacrificial substrate layer, removing the sacrificial substrate layer to release the semiconductor film, and at least partially filling the plurality of holes in the released semiconductor film with a filler material. If the semiconductor film is a trilayered structure comprising a single-crystalline layer of compressively-strained semiconductor material disposed between a first single-crystalline layer of unstrained semiconductor material and a second single-crystalline layer of unstrained semiconductor material, the unstrained semiconductor material becomes a tensilely strained semiconductor material upon the release of the film.

The step of filling the plurality of holes in the released semiconductor film may be carried out by transferring the released film onto a host substrate and epitaxially growing a filler material in the holes. If the semiconductor film is the device layer of a semiconductor-on-insulator substrate, 'transferring' the released film may simply mean allowing the semiconductor film to fall onto the underlying handle wafer after the buried oxide layer (i.e., the sacrificial layer) is removed. In this embodiment, the filler material desirably has a faster epitaxial growth rate than the semiconductor material of the released semiconductor films, such that the growth of the filler in the holes will eventually reach the top surface of the thin film, at which point the epitaxial growth process can stop, thereby producing a heterogeneous nanomembrane structure with a planar top surface.

In an alternative method, the nanomembrane-based structures may be made by forming a plurality of holes in a semiconductor substrate and placing a thin semiconductor film over the plurality of holes, wherein the thin semiconductor film is sufficiently flexible to at least partially, and desirably fully, fill the holes. The thin semiconductor film then may be removed above and between the holes in the substrate. Typically, the thin semiconductor film in this method may have a thickness of no greater than about 50 nm. The thin semiconductor film may be single or multilayered films, including strained trilayered films, as described above. The semiconductor substrate may be a bulk semiconductor substrate, such as a conventional semiconductor wafer. In this design, the nanomembrane structure becomes integrated into the top surface of the semiconductor substrate. Alternatively, the semiconductor substrate may be built into the thin device layer of a semiconductor-on-insulator substrate. Finally, the semiconductor substrate itself may be a single or multilayered thin film. For example, the semiconductor substrate may be a strained trilayer thin film, as described above, having a plurality of holes extending therethrough, over which a second thin, flexible semiconductor film is placed to fill in the holes.

Because this alternative method does not depend upon epitaxial growth to form the heterogeneous nanomembrane-based structure, it is well suited for the production of heterogeneous nanomembrane structures made from different semiconductor materials, including various combinations of Group IV semiconductors (e.g., silicon, germanium, and alloys thereof) and Group III-V semiconductors (e.g., GaN and GaAs).

Further objects, features and advantages of the invention will be apparent from the following detailed description when taken in conjunction with the accompanying drawing.

DETAILED DESCRIPTION OF THE INVENTION

The present nanomembrane structures include a multilayer film comprising a thin layer of a first, single-crystalline semiconductor material having a plurality of islands of a second semiconductor material distributed therein. The first and second semiconductor materials differ in at least one of crystalline orientation, material composition, or strain state. The nanomembrane structures may be designed for use in hybrid-orientation technology applications, including CMOS devices. The layer of single-crystalline semiconductor material may be, but is not necessarily, incorporated into a multi-layered semiconductor nanomembrane, such as a bilayer or a trilayer.

As an illustrative example, the nanomembrane structure may include a single-crystalline layer of Si(110) which defines a plurality of holes, wherein the holes are fully or partially filled with Si(001). The single-crystalline layer of Si(110) having a plurality of holes extending therethrough may be made according to the method described in U.S. Patent Application Publication No. 2007/0187719. Briefly, the method includes the steps of obtaining or fabricating a thin layer of Si(110) over a sacrificial layer, patterning an array of holes into the Si(110) layer, and removing (e.g., etching away) the sacrificial layer to release the Si(110). For example, the Si(110) thin film may be made from the device layer of a silicon(110)-on-insulator substrate that includes a thin Si(110) layer that is disposed on a buried silicon oxide layer (i.e., the sacrificial layer) that is supported on an underlying Si handle layer. Once the sacrificial layer has been removed, the released Si(110) layer may be transferred to a desirable host substrate, for example Si(001), which may serve as a template for the epitaxial growth of Si(001) in the plurality of holes. Methods of transferring the released layer to a host substrate are described in U.S. Patent Application Publication No. 2007/0187719.

The host substrate may be a bulk substrate, a thin film, or an SOI substrate. In the latter case, the released thin film (Si(110) in the example above) may be transferred onto the device layer of the semiconductor-on-insulator substrate and the second semiconductor material (Si(001) in the example above) may be grown up through the holes. This structure is very useful because it takes advantage of the buried oxide layer, just as in more conventional SOI structures. However, the device layer of the SOI host substrate also may be released from the underlying buried oxide and handle wafer in a subsequent processing step, wherein a second set of holes is patterned through the device layer of the host substrate and the buried oxide of the host substrate is etched away. (Alternatively, the buried oxide could be removed using a backside etch, wherein holes are patterned through the handle wafer rather than the device layer.) The net result is a free-standing nanomembrane structure that includes a composite thin film comprising a film of a first semiconductor material (a Si(110) film in the example above) having a plurality of islands of a second semiconductor material (Si(001) in the example above) distributed therein, wherein the composite thin film is supported by a thin film of the second semiconductor material. This structure may then be transferred to a variety of substrates, including bulk or thin film semiconductor, metal, dielectric and polymeric substrates for use in a variety of devices including thin-film transistors (TFTs) and CMOS devices.

In another illustrative example, the nanomembrane structure may include a multilayered semiconductor thin film comprising a compressively strained semiconductor material disposed between a first single-crystalline layer of tensilely strained semiconductor material and a second single-crystalline layer of tensilely strained semiconductor material. A plurality of holes extending through the nanomembrane are at least partially, and preferably entirely, filled with a filler material which is also a semiconductor, but which differs from the tensilely strained semiconductor materials in composition, crystal orientation, or both.

Figure 1:
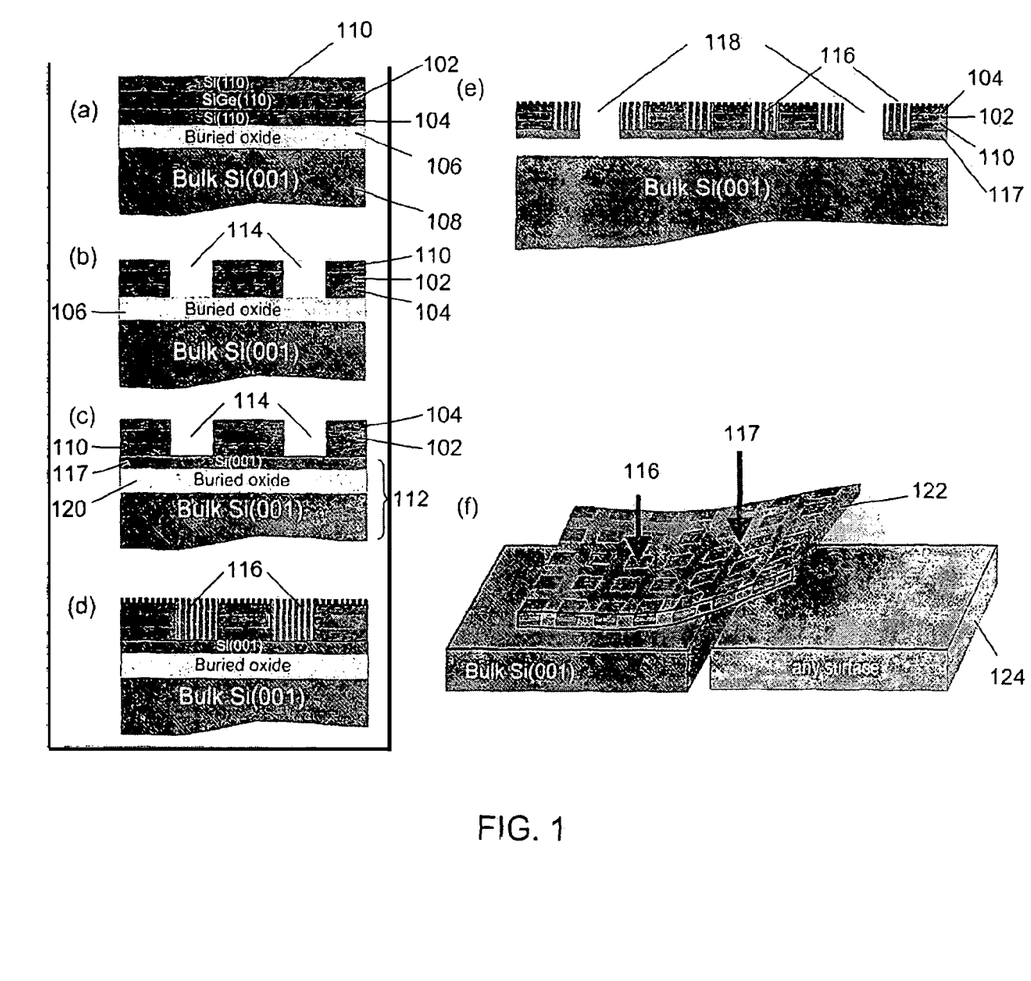
FIG. 1 illustrates a method for forming the nanomembrane-based structures of the present invention.

Strained, multilayered nanomembranes for use in the present structures may be made according to the method described in Roberts, M. M., Klein, L. J., Savage, D. E., Slinker, K. A., Friesen, M., Celler, G. K., Eriksson, M. A., and Lagally, M. G., *Nature Materials* 5, 388 (2006); and Scott, S. A. and Lagally, M. G., *J. Phys. D.* 40, R75 (2007). The strain in these nanomembranes is the result of elastic strain sharing between the layers of a free-standing sandwich of heteroepitaxially grown multilayered semiconductor films, such as Si/SiGe/Si films. The method for making these nanomembranes is illustrated in FIG. 1. A more detailed description of the method for making the nanomembranes is provided in the Examples section, below. Briefly, a compressively strained semiconductor (e.g., SiGe) layer 102 is grown (preferably to a thickness below its kinetic critical thickness for dislocation-driven relaxation) on an unstrained semiconductor layer 104 which is supported by a sacrificial layer 106 located on top of a handle layer 108 (e.g., on the silicon template layer of a silicon-on-insulator (SOI) substrate, where the thin buried oxide layer serves as the sacrificial layer), followed by the growth of another semiconductor layer (e.g., another Si layer) 110 over the strained semiconductor layer (step (a)). Selective chemical removal of the sacrificial layer (e.g., buried oxide or insulator) releases the trilayer semiconductor thin film, creating a temporarily free-standing membrane, and thus allowing compressive strain in the center layer 102 to be partially transferred to tensile strain in the two outer semiconductor layers 104, 110. In the case of a Si/SiGe/Si trilayer film, the two Si layers in the structure relax by laterally expanding laterally (Roberts, M. M., Klein, L. J., Savage, D. E., Slinker, K. A., Friesen, M., Celler, G. K., Eriksson, M. A., and Lagally, M. G., *Nature Materials* 5, 388 (2006)). The resulting elastically-relaxed, thin and dislocation-free multiple-layer membrane may be transferred to, and bonds readily to, other host substrates (shown in step (b)). Said substrates include bulk substrates, thin films, or semiconductor-on-insulator substrates 112. A plurality of holes 114, formed to facilitate the selective chemical removal of the sacrificial layer, are then filled with a semiconductor filler material 116 which has a different crystalline orientation, composition and/or strain state to provide a heterogeneous semiconductor nanomembrane of a first material containing a plurality of integrated islands of a different semiconductor material.

One version of the process described above is illustrated schematically FIG. 1, which uses a Si/SiGe/Si multilayered thin film as an illustrative example to make a mixed-orientation/mixed strain multilayered nanomembrane stricture. Step (a) in FIG. 1 depicts an "as grown" Si/SiGe/Si(110) heterostructure. Step (b) shows the heterostructure after lithography and reactive ion etching of regions that will eventually be filled with Si(001). In the present methods, these regions initially serve to allow an etchant access to the buried oxide layer which is to be removed. As shown in step (c), after the buried oxide layer is removed to release the trilayered nanomembrane from the underlying substrate, the Si layers of the membrane are under tensile strain. Step (c) shows the trilayered nanomembrane after transfer to the device layer of an SOI(001) host. After the transfer, the underlying (001) oriented host Si layer 117 is exposed through the holes in the nanomembrane. Step (d) shows chemical vapor deposition (CVD) growth of Si(001) onto the new structure to fill the holes. Because CVD growth is significantly faster on Si(001) than on Si(110), the holes are eventually filled and the height of the Si(001) regions becomes equal to the depth of the holes in the Si(110). White lines in the diagram indicate regions of CVD overgrowth. This structure is itself very useful because it takes advantage of the buried oxide layer, just as in more conventional SOI structures. However, as shown in step (e), the strained trilayered composite nanomembrane and the underlying Si(001) device layer may be released from the rest of the SOI substrate by patterning holes 118 through the device layer and etching away the underlying buried oxide 120 of the host substrate. Step (f) illustrates the final-mixed orientation/mixed strain nanomembrane structure 122. This structure may then be transferred to a variety of substrates, including bulk or thin-film semiconductor, metal, dielectric and polymeric substrates 124, for use in a variety of devices, including thin film transistors (TFTs) and CMOS devices.

As noted above, when the released membrane is transferred to a Si(001) host (e.g., FIG. 1(c)), the holes in the membrane provide ready access to a Si(001) substrate, while the surrounding membrane surface is strained Si(110). This architecture provides an opportunity to process the membranes further (for example, device isolation and selective epitaxy) in a manner similar to other forms of HOT fabrication, as described in Yang, F., et al., *IEDM Tech. Digest* 18.7.1 (2003). The advantage here is that the use of membranes allows simple incorporation of dislocation-free strained Si(110) surfaces into HOT schemes, with the benefit of significant carrier mobility enhancement over unstrained Si(110). The holes in the membrane that provide access to the host substrate can be made to any size and shape (within the limits of lithography) and may be regularly or randomly spaced in the film. The fact that CVD growth on Si (001) is much faster than on Si(110) allows the fabrication, using conventional epitaxy techniques, of a planar surface that is effectively a quilt of (110) and (100) orientations. The membranes are capable of withstanding high-temperature device processing.

The resulting strained, heterogeneous nanomembrane structures are well-suited for use in a variety of applications which incorporate both n-type devices or components and p-type devices or components. In such applications, the n-type devices (e.g., nFETs) can be fabricated on the high-electron-mobility (001) regions, while p-type devices (e.g., pFETs) formed on the dislocation-free: strained Si(110) could utilize hole mobility enhancements of up to 75% compared to the (001) universal mobility. The ability to traisfer the strained membranes to a variety of host substrates also opens the possibility of optimizing channel direction in both types of devices via rotating the strained (110) membrane relative to its (001) host during transfer. The new (001) host could be a conventional SOI(001) substrate, which would enable a second release and transfer to almost any other surface, allowing the potential mobility enhancements in this novel combination membrane to be used in a vast array of emerging applications, such as flexible, high-performance electronics.

Figure 3:
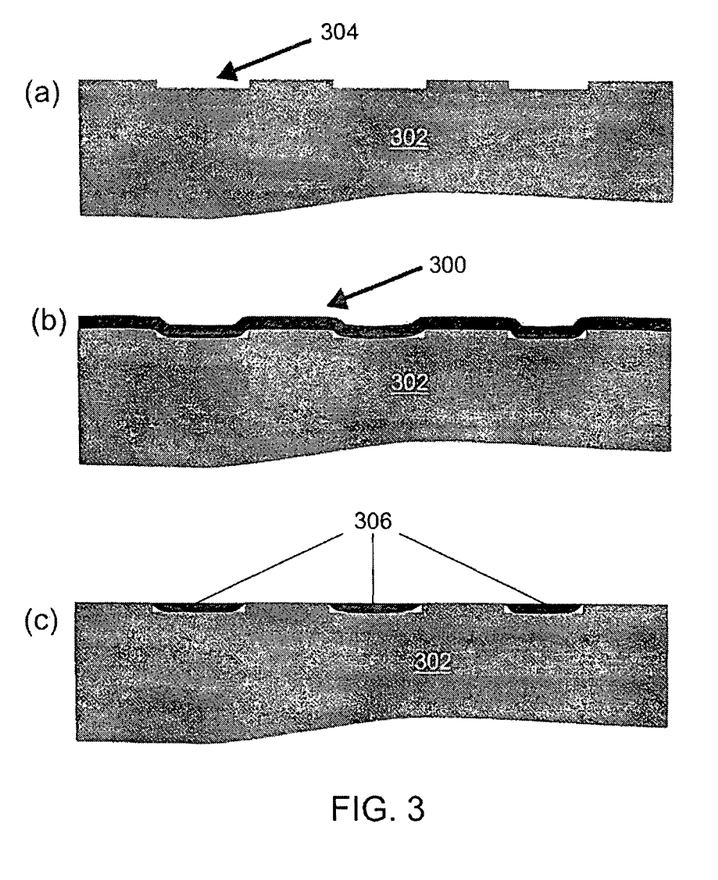
FIG. 3 depicts an alternative method for integrating two different materials by draping a semiconductor membrane over a plurality of holes, followed by removal of the excess membrane material surrounding the holes.

Much of the discussion above focuses on methods of filling holes in a first semiconductor material by growing a second semiconductor material into the holes using an underlying host substrate as a template for said growth. However, the present invention also contemplates an alternative method for producing the present heterogeneous nanomembrane structures. This method does not rely upon epitaxial growth of the second semiconductor material and, therefore, is well-adapted for the production of heterogeneous nanomembranes that incorporate a wide range of different semiconductor materials. FIG. 3 provides a schematic illustration of this method, in which a thin, flexible semiconductor film 300 is draped over a semiconductor substrate 302 having a plurality of holes 304 extending into its surface. The thin semiconductor film falls into the holes such that they are partially or entirely filled by the thin film (step b). Those portions of the thin film that remain outside the holes are then removed. (step c). The result is a, heterogeneous semiconductor layer that includes regions 306 of a second semiconductor material disposed in a first semiconductor material. The thin semiconductor films 300 may be, single or multilayered films, including strained trilayered films of the type described above.

The semiconductor substrate may be a bulk semiconductor substrate, such as a conventional semiconductor wafer. In this design, the heterogeneous nanomembrane structure becomes integrated into the top surface of the semiconductor substrate. For example, the substrate may be a bulk Si(001) substrate and the semiconductor thin film may be a germanium (Ge) or Si(110) thin film. Alternatively, the substrate may be a bulk GaN or GaAs substrate and the thin film may be a Si(001) thin film or even a metal film. These specific examples are provided for illustrative purposes only. Many other combinations of semiconductor substrates and thin films could also be used.

The semiconductor substrate may be a semiconductor-on-insulator substrate. In this embodiment, the holes in the substrate may be formed in the device layer of the substrate. The heterogeneous nanomembrane structure in this design is integrated into the device layer of the semiconductor-on-insulator substrate. This structure is itself very useful because it takes advantage of the buried oxide layer, just as in more conventional SOI structures. However, if desired, the buried oxide layer of the host substrate may be removed to release the heterogeneous nanomembrane as a free-standing film which may be transferred to a variety of substrates, including bulk or thin film semiconductor metal, dielectric and polymeric substrates for use in a variety of devices, including thin film transistors (TFTs) and CMOS devices.

This method is flexible and able to make a wide variety of interesting thin, composite semiconductor layers using a combination of single- and multilayered substrates and single and multilayered thin films. For example, a strained trilayer semiconductor thin film comprising a compressively strained semiconductor material disposed between a first single-crystalline layer of tensilely strained semiconductor material aid a second single-crystalline layer of tensilely strained semiconductor material may be used as a substrate material. (The formation of such structures on SOI substrates has already been described in detail herein.) A plurality of holes may be formed in the trilayer thin film, and a single- or multilayer semiconductor thin-film may be draped over the trilayer to fill in the holes. For example, the thin film itself may be a strained trilayer thin film. After those portions of the thin film that lie outside the holes have been removed, a trilayer nanomembrane having a plurality of single or multilayer islands is produced. This structure may remain attached to an underlying substrate, or may be released as a free-standing membrane using the techniques described herein. In a variation of this embodiment, the holes in the trilayer substrate may be etched only part of the way through the trilayer before being filled with a second semiconductor material in the form of a semiconductor thin film in order to create complex, multiple-channel devices or devices having novel optical properties. For example, the holes may extend through only the top layer in the trilayer or through only the top two layers in the trilayer.

The invention will be further described by reference to the following examples, which are presented for the purpose of illustration only and are not intended to limit the scope of the invention.

EXAMPLES

A multilayered semiconductor thin film nanomembrane was fabricated from an SOI(110) substrate (Soitec) composed of a 190-nm-thick Si(110) template layer, separated from a bulk Si(001) handle substrate by a 150-nm-thick buried oxide layer (BOX). The template layer was thinned to 12 nm via thermal oxidation at 1050° C. and stripping of the thermal oxide in dilute hydrofluoric acid (HF). This template layer becomes the bottom layer of a Si/SiGe/Si(110) heterostructure with thickness and composition 12 nm Si/80 nm $Si_{0.91}Ge_{0.09}$/10 nm Si. A membrane stack with 20% Ge content in the alloy layer for structural comparison to the 9% alloy layer membranes (the alloy layer and Si capping layer were grown to a thickness of 80 nm and 38 nm respectively) was also fabricated.

The SiGe and top Si layers were epitaxially grown by either chemical vapor deposition (CVD) in a cold-wall, ultra-high-vacuum (UHV) CVD reactor using silane and germane precursors, or by solid-source, molecular beam epitaxy (MBE). For CVD growth, the temperature dependence of the growth rate and the Ge fraction in the alloy layer are given in Table 1 for membranes with a Ge content of 9% and 20%. For the membranes with a 9% Ge composition alloy, the alloy layer was grown at 660° C.; while for the 20% Ge composition sample, the alloy growth temperature was 720° C. The deposition temperature for the top Si layer was 720° C. in both cases. Precursor gas flow rates for the $Si/Si_{0.91}Ge_{0.09}$/Si membranes were set at 52 and 8 standard cubic centimeters per minute (SCCM) for $SiH_4$ (10% with balance $H_4$) and $GeH_4$ (20% with balance $H_4$), respectively, yielding a total pressure of ~26 mTorr. For the 20% Ge alloy, the $GeH_4$ flow rate was 14 SCCM. For a given temperature, the growth rate on Si(110) is much less than the growth rate on Si(001) (for example, at a typical growth temperature of 580° C., the growth rate of Si on Si(001) is approximately 4 nm/min. Growth was monitored in situ using reflection high-energy electron diffraction (RHEED) to ensure a planar (rather than rough, 3D) growth front. For MBE, a growth rate of 2.5 nm/min at 550° C. was used.

TABLE 1

| Membrane | Material | Growth Temperature (° C.) | Growth Rate (nm/min) |
|---|---|---|---|
| 1 | $Si_{0.91}Ge_{0.09}$ | 660 | 1.2 |
|  | Si | 720 | 1.7 |
| 2 | $Si_{0.80}Ge_{0.20}$ | 720 | 1.3 |
|  | Si | 720 | 2.1 |

The dependence of SiGe and Si growth rates (CVD) on temperature for (110) membranes with a 9% and a 20% Ge composition alloy layer is shown in Table 1.

The resulting as-grown (unreleased) heterostructures were composed of a compressively-strained alloy layer and two Si layers that maintain their bulk lattice constant because the BOX/template interface pins the template layer at its original, relaxed, lattice constant during growth, as described in Roberts, M. M., Klein, L. J., Savage, D. E., Slinker, K. A., Friesen, M., Celler, G. K., Eriksson, M. A., and Lagally, M. G., *Nature Materials* 5, 388 (2006). The as-grown membrane structures were characterized before release with high-resolution x-ray diffraction (XRD) to confirm the thickness and composition of the layers and to provide a reference for the strain state prior to release, and with intermittent-contact-mode atomic force microscopy (AFM) to investigate the growth front morphology.

The tri-layer membranes (typical size 3×3 mm²) were then released by selective removal of the BOX layer, as described in Roberts, M. M., Klein, L. J., Savage, D. E., Slinker, K. A., Friesen, M., Celler, G. K., Eriksson, M. A., and Lagally, M. G., *Nature Materials* 5, 388 (2006), and depicted schematically in FIG. 1. To enhance etchant access to the BOX, an array of access holes was patterned and etched through the membrane via photolithography and reactive ion etching (RIE) to expose the BOX. Submersion in 49% HF for 60-minutes resulted in selective removal of the BOX and release of the membrane, allowing elastic strain sharing between the semiconductor layers. The alloy layer now partially transferred some of its compressive strain to tensile strain in the Si layers as the system elastically relaxed (i.e., without forming dislocations). The magnitude of strain transfer depends on both the Ge content in the alloy layer and the thickness ratio of the layers as described in Roberts. M. M., Klein, L. J., Savage, D. E., Slinker, K. A., Friesen, M., Celler, G. K., Eriksson, M. A., and Lagally, M. G., *Nature Materials* 5, 388 (2006), with the final strain in the Si layers given by $$\varepsilon_{Si} = -\varepsilon_m \frac{t_{SiGe} M_{SiGe}}{t_{Si} M_{Si} + t_{SiGe} M_{SiGe}}$$

where $\varepsilon_m$ is the mismatch strain, and $\varepsilon$, M, and t, are the layer strain, biaxial moduli, and thicknesses of the Si and SiGe layers, respectively. The use of ultra-thin Si layers, relative to the thickness of the alloy layer, maximizes the tensile strain in the two Si layers.

Upon release, the membranes initially settled on the handle substrate, after which the membranes were again characterized with XRD and AFM. Some membranes were then transferred to a new host substrate by agitating the released membrane (which was only weakly bound to the original handle wafer on which it had settled) in deionized (DI) water. The floating membranes may be collected by bringing them into contact with the new host, which can be a variety of materials. For example, if the new host is a chemically-cleaned Si substrate, the membrane can be bonded to this substrate on a hotplate at 100° C. for 10 minutes and then at 500° C. for 10 minutes. The (110) membrane release, transfer, and bonding to a new host are quite similar to those for Si(001). As in Si (001), the strain condition is maintained during bonding as described in Yuan, H-C, Roberts, M. M., Savage, D. E., Lagally, M. G., and Ma, Z. Q., 2005 *International Semiconductor Device Research Symposium*, IEEE, Piscataway, N.J., 207 (2005); and Yuan, H-C, Ma, Z. Q., Roberts, M. M., Savage, D. E., and Lagally, M. G., *J. Appl. Phys.* 100, 013708 (2006).

Figure 2:
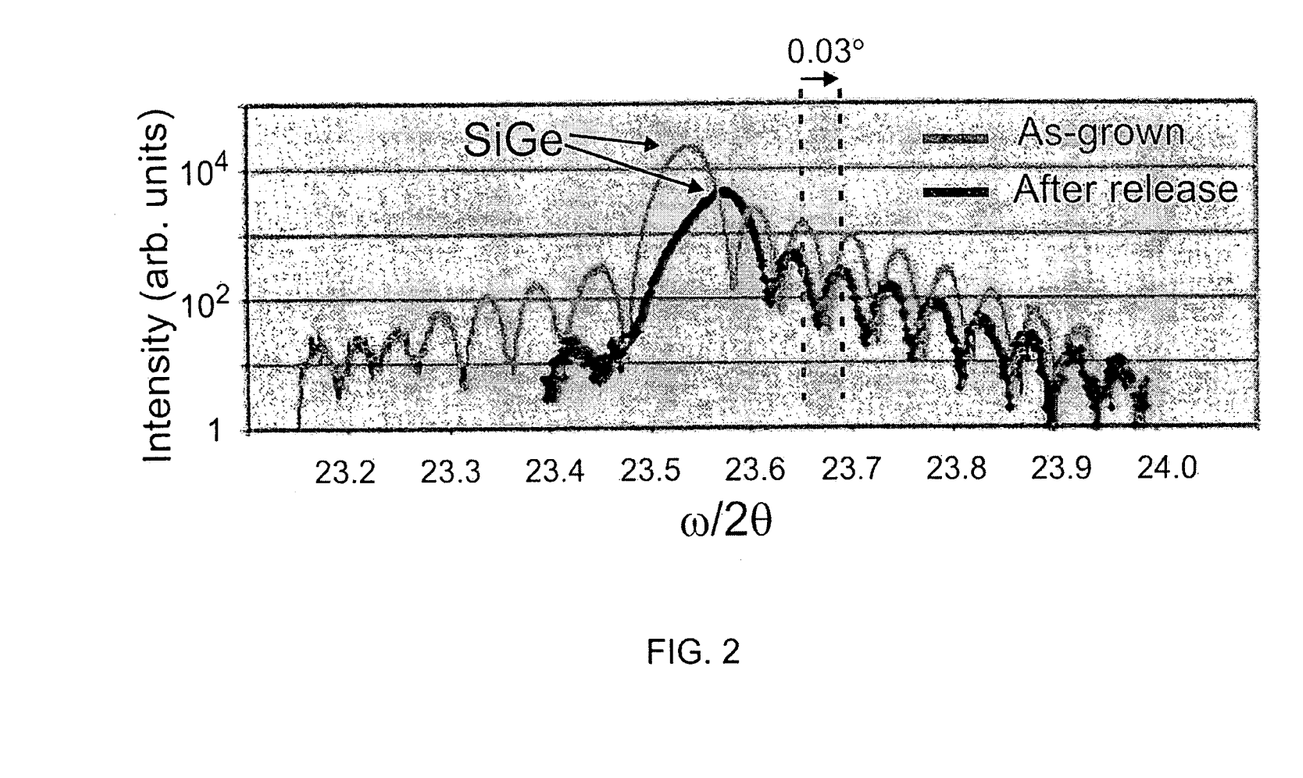
FIG. 2 shows x-ray diffraction scans of an as-grown trilayer nanomembrane and of the released nanomembrane.

To confirm the crystal quality and determine the strain state, XRD was performed. XRD (θ/2θ) scans were taken around the (220) reflection of a $Si/Si_{0.91}Ge_{0.09}/Si$ membrane (CVD grown) both before and after release, and the peak shifts were evaluated, as described in Fatemi, M., *J. Crystal Growth* 169, 261 (1996). In a (θ/2θ) scan, the peaks are associated with the out-of-plane lattice constants. Reference scans of the (004) reflection from the Si(001) handle substrate were also performed to ensure accurate calibration of the peak positions and shifts. FIG. 2 shows XRD (θ/2θ) scans of the (220) reflection from an as-grown $Si(110)/Si_{0.91}Ge_{0.09}(110)/Si(110)$ heterostructure, and after release-in-place (see legend). The single prominent peak visible in both of the scans originates from the alloy layer. The absence of a prominent Si peak is due to the thinness of the Si layers; however, the presence of strong interference fringes indicates coherency at the interfaces, as described in Fewster, P. F., "X-ray scattering from semiconductors," Imperial College Press, London (2001). After release, the thickness fringes were still present, and all peaks moved by 0.03° to higher diffraction angle, corresponding to a uniform in-plane expansion of the lattice. The combination of the presence of interference fringes and uniform peak shifts confirmed that the compressive strain relieved in the alloy layer was transferred to tensile strain in the Si layers without inelastic relaxation, the extent of the transfer being determined by the relative thicknesses of the Si and alloy layers.

For a (110)-oriented film, the out-of-plane compressive strain $\varepsilon_\perp$ in the Si layers after release may be calculated from Bragg's law using the ±0.03° peak shift. This compressive strain may be converted to in-plane tensile strain $\varepsilon_\parallel$ using the expression $$\varepsilon_\parallel = -\left(\frac{c_{11} + \frac{1}{2}C}{2c_{12} - \frac{1}{2}C}\right)\varepsilon_\perp$$

with $C = 2c_{44} - c_{11} + c_{12}$ where $c_{ij}$ are the elastic constants of Si, as described in Fatemi, M., *J. Crystal Growth* 169, 261 (1996); and Hornstra, J. and Bartels, W. J., *J. Crystal Growth* 44, 513 (1978). This equation yields the relation $\varepsilon_\parallel = -1.961\varepsilon_\perp$ and an in-plane biaxial tensile strain of 0.23±0.02% in the Si layers. In contrast, in a (001)-oriented film, $\varepsilon_\parallel = -1.299\varepsilon_\perp$.

To further confirm elastic strain sharing the $Si/Si_{0.91}Ge_{0.09}/Si(110)$ membrane, (331) (off-axis) reciprocal-space maps were measured. These track both in-plane and out-of-plane lattice constant changes. The map taken before release clearly demonstrated that the intensity was conformal about a line parallel to the plane normal; i.e., the system was coherent (epitaxial relationship in all the layers). The map taken after the membrane was released, showed that the intensity remained conformal to a line parallel to the plane normal, indicating that the system was also coherent after release, a requirement for elastic strain sharing.

The surface roughness of the $Si/Si_{0.91}Ge_{0.09}/Si(110)$ membranes grown with CVD was measured with AFM. The RMS roughness of an as-grown membrane was 1.7±0.2 nm, determined from an average of 3 scans of size 5×5 µm². The measured RMS roughness after release was 1.8±0.2 nm.

Growth front roughening during heteroepitaxy depends on both the Ge content in the alloy and the growth temperature. Therefore, for applications where a smoother growth front is desirable or necessary, the use of lower Ge-content alloys in the nanomembranes and/or lower growth temperatures may be desirable. CVD growth on the Si(110) surface proceeds at a much slower rate than on Si(001). As mentioned above, typical Si(001) growth at 580° C. proceeds at 4 nm/min, while Si(110) growth proceeds only at ~2 nm/min at the much higher temperature of 720° C. A minimum practical (precursor decomposition limited) growth temperature of around 660° C. for CVD growth of SiGe(110) may make it impractical to smooth the growth front via growth at a lower temperature. In this case, membrane growth by molecular beam epitaxy (MBE) may be a preferable option to obtain a smoother growth front. In MBE, the minimum growth temperature is not dictated by precursor dissociation. In the present studies, an AFM image of a $Si(110)/Si_{0.91}Ge_{0.09}$ (110)/Si(110) membrane grown with MBE at a temperature of 550° C., with thicknesses identical to the CVD-grown membranes, measured a root mean square (RMS) roughness of 0.38±0.03 nm and 0.42±0.03 nm before and after release of the membrane, respectively. This RMS roughness is comparable to the RMS roughness previously reported for (001) membranes grown with CVD in Roberts, M. M., Klein, L. J., Savage, D. E., Slinker, K. A., Friesen, M., Celler, G. K., Eriksson, M. A., and Lagally, M. G., *Nature Materials* 5, 388 (2006).

Despite its rough growth front, the RMS outer-surface roughness of a CVD grown $Si(110)/Si_{0.91}Ge_{0.09}(110)/Si$ (110) membrane transferred to a new host substrate can be reduced by almost an order of magnitude by simply flipping the membrane during transfer. Flipping exposes the smooth Si(110) surface of the template layer that initially formed the BOX/template layer interface (RMS roughness=0.20±0.02 nm), after which Si device processing, e.g., in a HOT process, can proceed normally.

There also exists the option to build yet higher levels of strain by performing another growth sequence on an elastically strained membrane that has been transferred to an oxidized Si host, and subsequently releasing this new multi-layer membrane. The alloy layer in a second growth sequence is grown on an already tensilely strained Si surface, allowing growth of a higher-Ge-composition layer without dislocations (smaller lattice mismatch between the Si and alloy layers).

For the purposes of this disclosure, and unless otherwise specified, "a" or "an" means "one or more." All patents, applications, references and publications cited herein are incorporated by reference in their entirety to the same extent as if they were individually incorporated by reference.

It is understood that the invention is not limited to the embodiments set forth herein for illustration, but embraces all such forms thereof as come within the scope of the following claims.

What is claimed is:

1. A heterogeneous nanomembrane structure comprising:
    (a) a multilayer film comprising a single-crystalline layer of compressively strained semiconductor sandwiched between, and in direct contact with, a first single-crystalline layer of tensilely strained semiconductor and a second single-crystalline layer of tensilely strained semiconductor, wherein a plurality of holes extend into the multilayer film, through the first single-crystalline layer of tensilely strained semiconductor, through the single-crystalline layer of compressively strained semiconductor and then through the second single-crystalline layer of tensilely strained semiconductor; and
    (b) a filler semiconductor at least partially filling the plurality of holes in the multilayer film, wherein the filler semiconductor differs from the tensilely strained semiconductor in material composition, crystalline orientation, strain state, or a combination thereof.

2. The structure of claim 1, further comprising a substrate layer comprising the filler semiconductor underlying the multilayer film.

3. The structure of claim 1, wherein the first and second single-crystalline layers of tensilely strained semiconductor are Si with a first crystalline orientation, and further wherein the filler semiconductor is Si with a second crystalline orientation.

4. The structure of claim 3, wherein the Si with the first crystalline orientation is Si(110) and the Si with the second crystalline orientation is Si(001).

5. The structure of claim 4, further comprising a silicon-on-insulator substrate underlying the multilayer film, the silicon-on-insulator substrate comprising a Si(001) layer that is disposed on a buried oxide layer that is disposed on a handle wafer, wherein the second single-crystalline layer of tensilely strained semiconductor is disposed on the Si(001) layer of the silicon-on-insulator substrate.

6. The structure of claim 4, further comprising a Si(001) substrate underlying the multilayer film to provide a free-standing, four-layer structure.

7. The structure of claim 4, wherein the filler semiconductor completely fills the plurality of holes in the multilayer film.

8. The structure of claim 3, wherein the Si with the first crystalline orientation is Si(001) and the Si with the second crystalline orientation is Si(110).

9. The structure of claim 8, wherein the filler semiconductor completely fills the plurality of holes in the multilayer film.

10. The structure of claim 3, wherein the filler semiconductor completely fills the plurality of holes in the multilayer film.

11. The structure of claim 1, wherein the filler semiconductor has a different material composition than the first and second single-crystalline layers of tensilely strained semiconductor.

12. The structure of claim 11, wherein the compressively strained semiconductor, the tensilely strained semiconductor and the filler semiconductor are independently selected from Si, Ge, GaN and GaAs.

13. The structure of claim 1, wherein the multilayer film has a thickness of no greater than about 500 nm.

14. The structure of claim 1, wherein the filler semiconductor comprises two or more layers of semiconductor that differ from one another in material composition, crystalline orientation, strain state, or a combination thereof.

15. The structure of claim 1, wherein the filler semiconductor has a different crystalline orientation than the first and second single-crystalline layers of tensilely strained semiconductor.

16. The structure of claim 1, wherein the filler semiconductor has a different strain state than the first and second single-crystalline layers of tensilely strained semiconductor, and further wherein the filler semiconductor is compressively strained.

17. The structure of claim 1, wherein the filler semiconductor completely fills the plurality of holes in the multilayer film.

* * * * *

UNITED STATES PATENT AND TRADEMARK OFFICE
CERTIFICATE OF CORRECTION

| | |
|---|---|
| PATENT NO. | : 8,803,195 B2 |
| APPLICATION NO. | : 12/045263 |
| DATED | : August 12, 2014 |
| INVENTOR(S) | : Max G. Lagally et al. |

It is certified that error appears in the above-identified patent and that said Letters Patent is hereby corrected as shown below:

IN THE SPECIFICATION

Col. 7, Line 64
Delete "material aid" and replace with --material and--

Col. 9, Line 53
Delete "where $\in_m$ is the mismatch strain, and $\in$" and replace with --where $\varepsilon_m$ is the mismatch strain, and $\varepsilon$--

Col. 10, Line 39
Delete "$\in_\perp$ in the Si" and replace with --$\varepsilon_\perp$ in the Si--

Col. 10, Line 41
Delete "$\in_\parallel$ using the" and replace with --$\varepsilon_\parallel$ using the--

Col. 10, Line 56
Delete "$\in_\parallel = -1.961 \in_\perp$" and replace with --$\varepsilon_\parallel = -1.961 \varepsilon_\perp$--

Col. 10, Line 58
Delete "$\in_\parallel = -1.299 \in_\perp$" and replace with --$\varepsilon_\parallel = -1.299 \varepsilon_\perp$--

Signed and Sealed this
Fourteenth Day of April, 2015

Michelle K. Lee
*Director of the United States Patent and Trademark Office*